US011147192B2

(12) United States Patent
Gao (10) Patent No.: US 11,147,192 B2
(45) Date of Patent: Oct. 12, 2021

(54) FLUID COOLING SYSTEM FOR AN ENCLOSED ELECTRONIC PACKAGE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 16 days.

(21) Appl. No.: 16/725,979

(22) Filed: Dec. 23, 2019

(65) Prior Publication Data

US 2021/0195804 A1 Jun. 24, 2021

(51) Int. Cl.
*H05K 7/20* (2006.01)
*H05K 7/18* (2006.01)
*G06F 1/18* (2006.01)
*G06F 1/20* (2006.01)

(52) U.S. Cl.
CPC ......... *H05K 7/20772* (2013.01); *G06F 1/183* (2013.01); *G06F 1/20* (2013.01); *H05K 7/183* (2013.01); *H05K 7/20254* (2013.01); *H05K 7/20272* (2013.01); *H05K 7/20781* (2013.01); *H05K 7/20872* (2013.01); *G06F 2200/201* (2013.01)

(58) Field of Classification Search
CPC ........... H05K 7/20772; H05K 7/20872; H05K 7/183; H05K 7/20781; H05K 7/20254; H05K 7/20272; G06F 1/20; G06F 1/183; G06F 2200/201
USPC .................................... 361/679.53, 699, 702
See application file for complete search history.

(56) References Cited

U.S. PATENT DOCUMENTS

| | | | | |
|---|---|---|---|---|
| 6,796,372 B2* | 9/2004 | Bear | ........................ | F28F 13/00 165/104.21 |
| 7,965,509 B2* | 6/2011 | Campbell | .......... | H05K 7/20772 361/699 |
| 8,004,841 B2* | 8/2011 | Cipolla | ................ | H01L 23/473 361/699 |
| 10,021,814 B2* | 7/2018 | Aoki | ........................ | G06F 1/203 |
| 10,448,543 B2* | 10/2019 | Farshchian | ............... | G06F 1/20 |
| 10,705,578 B2* | 7/2020 | Franz | ................. | H05K 7/20809 |
| 10,980,154 B1* | 4/2021 | Gao | .......................... | G06F 1/20 |
| 2007/0070605 A1* | 3/2007 | Straznicky | ........... | H05K 7/1461 361/702 |
| 2008/0013283 A1* | 1/2008 | Gilbert | ............... | H05K 7/20772 361/715 |
| 2008/0225485 A1* | 9/2008 | Altman | ............. | H01Q 21/0025 361/699 |
| 2010/0300652 A1* | 12/2010 | Lee | ....................... | H01L 23/427 165/80.4 |

(Continued)

*Primary Examiner* — Stephen S Sul
(74) *Attorney, Agent, or Firm* — Womble Bond Dickinson (US) LLP (57) ABSTRACT

A fluid cooling system for an electronics package having a chassis is disclosed. The system includes an electronics package housed within a chassis, one or more mounting structures attached to the chassis, and a fluid cooling module interfaced with one or more electronics of the electronics package, the fluid cooling module housed within the chassis and mounted to the one or more mounting structures, where circulation of a fluid of the fluid cooling module cools the one or more electronics. A chassis fluid distribution manifold is used to connect with the chassis fluid inlet and outlet and to distribute fluid within the chassis.

20 Claims, 11 Drawing Sheets

(56) References Cited

U.S. PATENT DOCUMENTS

| | | | | |
|---|---|---|---|---|
| 2011/0209855 | A1* | 9/2011 | Peterson | G06F 1/20 |
| | | | | 165/104.26 |
| 2014/0029193 | A1* | 1/2014 | Alshinnawi | H05K 7/20772 |
| | | | | 361/679.47 |
| 2014/0233175 | A1* | 8/2014 | Demange | H05K 7/20254 |
| | | | | 361/679.47 |
| 2015/0009624 | A1* | 1/2015 | Dunwoody | H05K 7/20636 |
| | | | | 361/688 |
| 2015/0055301 | A1* | 2/2015 | So | H05K 7/20509 |
| | | | | 361/701 |
| 2016/0128227 | A1* | 5/2016 | Gernert | H05K 7/20336 |
| | | | | 165/104.21 |
| 2017/0245397 | A1* | 8/2017 | Hirano | H05K 7/20809 |
| 2018/0107256 | A1* | 4/2018 | Mundt | H05K 7/20836 |
| 2018/0263137 | A1* | 9/2018 | Jensen | G06F 1/20 |
| 2018/0341298 | A1* | 11/2018 | Cheng | H05K 7/20818 |
| 2019/0289752 | A1* | 9/2019 | Ma | H05K 7/20154 |
| 2020/0241609 | A1* | 7/2020 | Selvidge | G11C 5/04 |
| 2020/0281094 | A1* | 9/2020 | Davis | G06F 1/20 |
| 2020/0305307 | A1* | 9/2020 | Amos | H05K 7/20772 |
| 2020/0390007 | A1* | 12/2020 | Edmunds | H05K 7/20236 |

\* cited by examiner

FIG. 10 ns system. The cooling system can be applied to a server chassis in a data center or

FLUID COOLING SYSTEM FOR AN ENCLOSED ELECTRONIC PACKAGE

FIELD OF THE INVENTION

Embodiments of the present invention relate generally to electronics cooling. More particularly, embodiments of the invention relate to a method for designing and assembling liquid cooling hardware for an enclosed electronic package (EEP) for devices or IT hardware/equipment used for edge computing.

BACKGROUND

Edge computing is an important technology in the AI and 5G era. Edge computing devices will enable some level of local data processing and storage. Edge computing requires the deployment of IT equipment/electronics closer to the end users such as smart phones, autonomous vehicles, smart homes and so on. Thus, the environment of deployment may be different from a case to case basis. In a data center, the deployment environment is very well controlled, such that the servers are operating at desired thermal and humidity conditions. However, edge devices may be deployed in an outside environment, which directly exposes the computing devices to outside air, i.e., a condition not appropriate for operating these devices. In some other applications, the electronics may be deployed in a harsh environment. This may impact on the long term reliability and/or normal operating of these electronics.

Previous attempts use traditional air cooling for the edge computing devices/electronics similar to an air cooling solution for IT equipment. Some shortfalls of air cooling include a limited cooling and exposing the electronics to the ambient environment may impact the operations and reliability of the electronics. Most of the current edge computing devices are designed using natural conduction cooling. However, this is only feasible for low power design devices. For higher power density devices, the surface temperature may exceed a design limit or the devices may not work properly.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

A fluid cooling thermal system can be used for an enclosed electronics package having electronic devices enclosed in a chassis/enclosure for an air-air separation of the devices with an external environment. The system can provide a thermal management solution for hardware packaged in the enclosed environment using liquid cooling devices applying cooling to the hardware. Since multiple types of hardware may be assembled on the motherboard, like a CPU, or GPU, or PCIE devices and many others, different embodiments of the system addresses different types of hardware. The entire enclosed package can be air-tight sealed and cooled using a fluid circulating through fluid inlet(s)/outlet(s) of the enclosed package. The cooling system can be applied to a server chassis in a data center or to mobile applications (e.g., the electronics package may be in motion), such as edge computing devices housed in a chassis in an autonomous vehicle.

According to an aspect, a fluid cooling system includes an electronics package mounted on a motherboard housed within a chassis; a first mounting structure attached to a first side panel of the chassis, including a first vertical mounting slot; a second mounting structure attached to a second side panel of the chassis, including a second vertical mounting slot; and a fluid cooling module across on top of the electronics package, wherein the fluid cooling module is mounted on the first and second mounting structures by inserted a first end and a second end of the fluid cooling module into the first and second vertical mounting slots. The fluid cooling module is to provide fluid cooling to a cold plate attached to a top surface of the electronics package.

In one embodiment, the chassis forms a fully enclosed environment for the electronics package such that no external air is exchanged with internal air to the enclosed environment. In one embodiment, the fluid cooling module includes a mounting rail attached to a mounting frame, the mounting frame mounted on the one or more mounting structures of the chassis, a fluid loop, and one or more cooling devices coupled to the fluid loop, where the one or more cooling devices are secured to the electronics of the electronics package through the mounting rail.

In another embodiment, the system further includes a fluid distribution unit coupled to the chassis, where the fluid distribution unit includes a fluid inlet, a fluid outlet, and a fluid distribution channel coupled to the fluid inlet and the fluid outlet, the fluid distribution channel to distribute a fluid from the fluid inlet to the fluid outlet. In another embodiment, the fluid loop is coupled to a fluid distribution channel of the fluid distribution unit.

In another embodiment, the fluid distribution unit further includes a fluid distribution manifold situated near a first side panel of the chassis to receive cooling fluid from the fluid inlet and to return warmer fluid to the fluid outlet. In another embodiment, the fluid loop includes a fluid supply loop section and a fluid return loop section, where the fluid supply loop section is to receive cooling fluid from the fluid inlet via the fluid distribution manifold to cool the electronics and the fluid return loop section is to return warmer fluid to the fluid outlet via the fluid distribution manifold.

In another embodiment, the chassis fluid distribution unit includes a fluid supply manifold situated near a first side panel of the chassis to receive cooling fluid from the fluid inlet, and a fluid return manifold situated near a second side panel of the chassis to return warmer fluid to the fluid outlet. In another embodiment, the fluid loop includes a fluid supply loop section and a fluid return loop section, where the fluid supply loop section is to receive cooling fluid from the fluid inlet via the fluid supply manifold to cool the cooling device and the fluid return loop section is to return warmer fluid from the cooling device to the fluid outlet via the fluid return manifold. The distribution unit can include one or more sub-inlets and sub-outlets for distribution of the fluid.

In one embodiment, the fluid loop includes a bendable or flexible fluid tube and/or hose. In another embodiment, the cooling devices include one or more cooling plates secured to at least a surface of the electronics to cool the surface of the electronics. In another embodiment, each of the one or more cooling plates is attachable to the fluid loop.

In another embodiment, the electronics include peripheral component interconnect express (PCIe) electronics coupled to a PCIe bus, and the one or more cooling plates are pressured to a surface of the PCIe electronics. In another embodiment, the system further includes a large cooling plate assembled near a bottom portion of the chassis, where the electronics include a motherboard, wherein the large cooling plate is coupled to a bottom surface of the motherboard to assist a cooling of the motherboard.

In another embodiment, the large cooling plate is assembled directly to a distribution channel of a fluid distribution unit to bypass a fluid loop. In another embodiment, each of the mounting structures includes a number of mounting teeth (e.g., serrations) along a length of the mounting structure to lock a mounting frame to the mounting structure and an unlock latch to deactivate the plurality of mounting teeth to release the mounting frame from the mounting structure.

In one embodiment, the electronics package includes electronics of a server blade as part of a server rack. In one embodiment, the electronics package includes electronics of an edge computing device for an autonomous vehicle.

The chassis for the electronics packages/devices (such as edge computing devices) where the cooling system are employed may be mobile. Although the disclosed systems are designed for the electronics packages/devices, however, these devices can be deployed for IT equipment in data centers.

Figure 1:
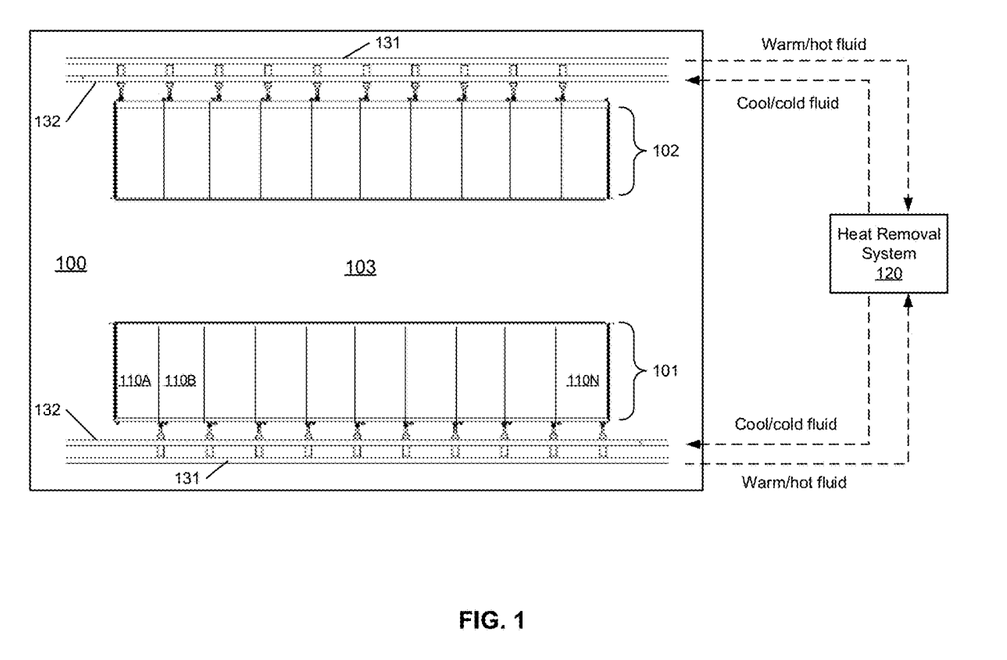
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of electronic racks of IT components operating therein. The electronic racks can include a heat removal liquid manifold, a number of server slots, and a number of server blades capable of being inserted into and removed from the server blades or server slots. Each server blade represents a computing node having one or more processors, a memory, and/or a persistent storage device (e.g., hard disk). At least one of the processors is attached to a liquid cold plate (also referred to as a cold plate assembly) to receive cooling liquid. Note that the heat removal system 120 may be coupled to multiple data center systems such as data center system 400.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, and waste heat recovery designs. Heat removal system 120 may include or be coupled to a cooling liquid source that provide cooling liquid.

In one embodiment, each server blade is coupled to the heat removal liquid manifold modularly such that a server blade can be removed from the electronic rack without affecting the operations of remaining server blades on the electronic rack and the heat removal liquid manifold. In another embodiment, each server blade is coupled to the heat removal liquid manifold (also referred to as a cooling liquid manifold) through a quick-release coupling assembly having a first liquid intake connector and a first liquid outlet connector coupled to a flexible hose to distribute the heat removal liquid to the processors. The first liquid intake connector is to receive heat removal liquid via a second liquid intake connector from a heat removal liquid manifold mounted on a backend of the electronic rack. The first liquid outlet liquid connector is to emit warmer or hotter liquid carrying the heat exchanged from the processors to the heat removal liquid manifold via a second liquid outlet connector and then back to a coolant distribution unit (CDU) within the electronic rack.

In one embodiment, the heat removal liquid manifold disposed on the backend of each electronic rack is coupled to liquid supply line 132 to receive heat removal liquid (also referred to as cooling liquid) from heat removal system 120. The heat removal liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 back to heat removal system 120. Liquid supply/return lines 131-132 are referred to as data center or room liquid supply/return lines (e.g., global liquid supply/return lines), which supply heat removal liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server blades in the electronic rack to deliver the cooling liquid to the cold plates of the processors.

According to one embodiment, each of the electronic racks includes an optional rack management unit (RMU) coupled to the CDU and each of the computing nodes of the electronic rack (not shown). The RMC periodically or constantly monitors operating status of the CDU, and computing nodes. The operating data of the operating status may include the operating temperatures of each processor, cooling liquid, etc. measured at real time. Based on the operating data received from various components, the RMU performs an optimization using an optimization function to determine the optimal pump speed of a liquid pump of the CDU, such that the power consumption of the liquid reaches minimum, while the liquid pump are operating properly according to their respective specifications (e.g., the speeds of the liquid pump are within their respective predefined ranges).

That is, the optimization is performed at a global level by optimizing all components involved simultaneously, such that 1) the temperatures of the processors are below their respective reference temperatures, 2) the total power consumption by the liquid pump reaches minimum, and 3) each of the liquid pump operates within their respective specification. The optimal pump speed is then utilized to configure the liquid pump. As a result, the total power consumption by the liquid pump reaches minimum while the processors of the computing nodes operate properly.

Figure 2:
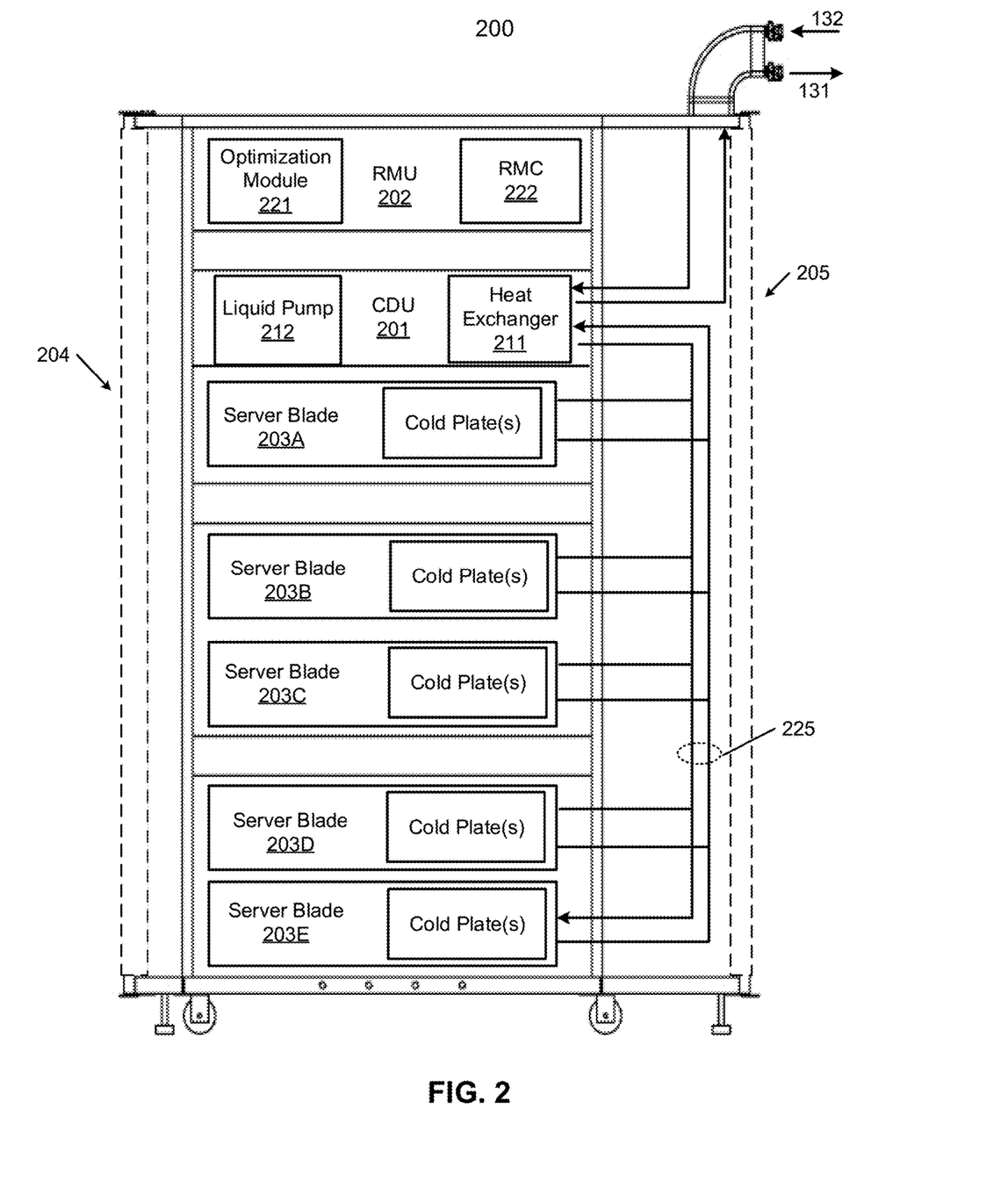
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, optional RMU 202, and one or more server blades 203A-203E (collectively referred to as server blades 203). Server blades 203 can be inserted into an array of server slots respectively from frontend 204 or backend 205 of electronic rack 200. Note that although there are five server blades 203A-203E shown here, more or fewer server blades may be maintained within electronic rack 200. Also note that the particular positions of CDU 201, RMU 702, and server blades 203 are shown for the purpose of illustration only; other arrangements or configurations of CDU 201, RMU 202, and server blades 203 may also be implemented. In one embodiment, electronic rack 200 can be either open to the environment or partially contained by a rack container. In another embodiment, electronic rack 200 can be fully contained and not exposed to the environment.

In one embodiment, CDU 701 mainly includes heat exchanger 711, liquid pump 712, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, are coupled to heat removal system 120 as described above. In addition, heat exchanger 211 further includes a second loop with two ports having a second pair of liquid connectors coupled to liquid manifold 225 to form a secondary loop, which may include a supply manifold (also referred to as a rack liquid supply line) to supply cooling liquid to server blades 203 and a return manifold (also referred to as a rack liquid return line) to return warmer liquid back to CDU 201. Note that CDUs 201 can be any kind of CDUs commercially available or customized ones. Thus, the details of CDUs 201 will not be described herein.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform).

In response to the request, the host server distributes the tasks to one or more of the performance computing nodes or compute servers (having one or more GPUs) managed by the host server. The performance compute servers perform the actual tasks, which may generate heat during the operations. The one or more compute servers may be edge compute servers having a motherboard and electronics horizontal mounted on the motherboard such as CPU/GPU electronics and electronics vertical mounted components, such as component vertically mounted on a PCIE expansion bus of a motherboard. These component may be memory modules, accelerators, or any other electronic components.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, and CDU 201. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the pump power generated by the liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive an optimal pump speed for liquid pump 212, such that the total power consumption of liquid pump 212 reaches minimum, while the operating data associated with liquid pump 212 is within their respective designed specifications. Once the optimal pump speed has been determined, RMC 222 configures liquid pump 212 based on the optimal pump speeds.

Figure 3:
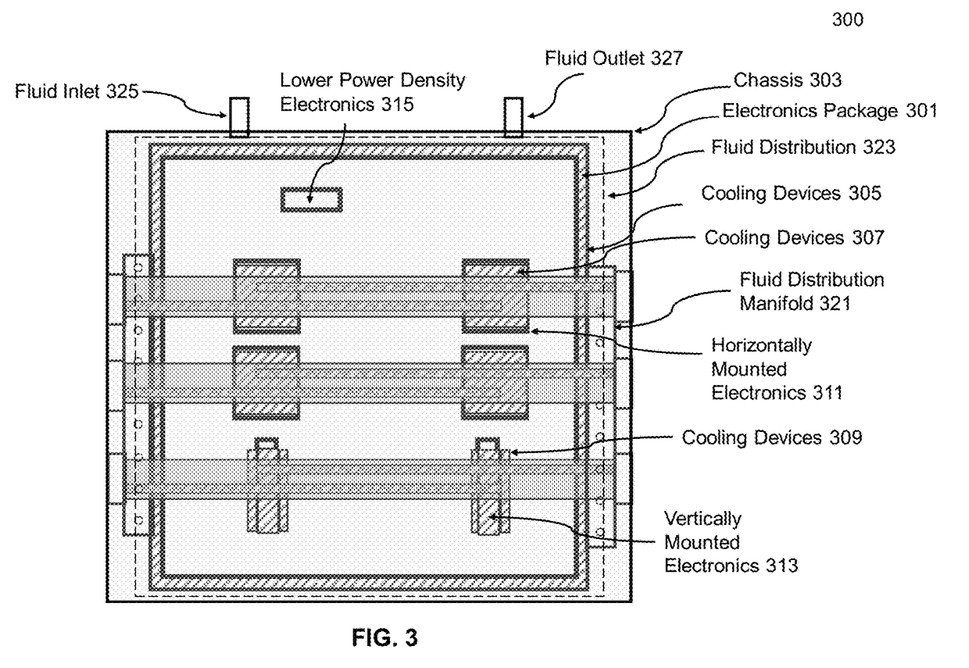
FIG. 3 is a block diagram illustrating a top view of a fluid cooling enclosure/chassis for an enclosed electronic package (EEP) according to one embodiment.

FIG. 3 is a block diagram illustrating a top view of a fluid cooling enclosure/chassis for an enclosed electronic package (EEP) according to one embodiment. Referring to FIG. 3, fluid cooling system 300 for an electronics package 301 held in a chassis 303 is disclosed. The electronics package can be enclosed/air-tight sealed within the chassis. The cooling system 300 includes a number of cooling devices/modules 305-309 for different types of electronics, both vertically mounted electronics 313 and horizontally mounted electronics 311. These cooling devices 305, 307, 309 are used for cooling heat generating electronics 311-315 including low density electronics 315 and high power density electronics 311-313.

In one embodiment, the cooling devices are cooling plates or mounting plates. For low power density electronics 315, their heat can be cooled by natural convection and/or a board cooling device (e.g., a board cooling plate) 305. The cooling system 300 can include a fluid distribution manifold 321 and/or fluid distribution/piping 323. The fluid distribution manifold 321 is used to distributing fluid to the cooling devices. The fluid distribution manifold 321 is coupled to the fluid inlet 325 and fluid outlet 327 for fluid to flow in and out of the fluid distribution manifold 321 respectively. The cooling system 300 can provide a fluid cooling design for the entire enclosure at the same time, provides a high separation of the fluid parts with the electronics.

Figure 4A:
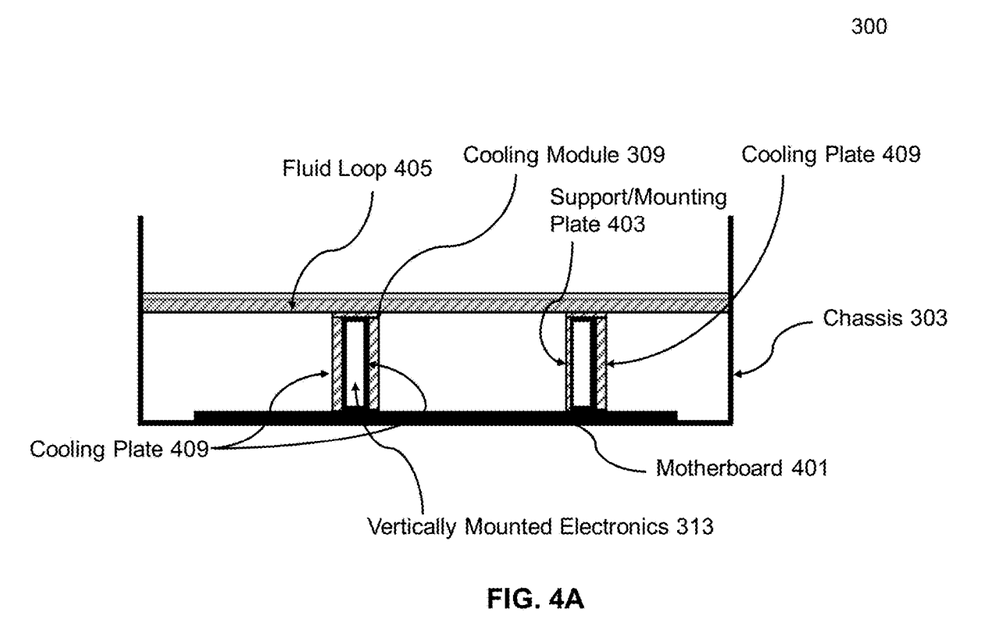
FIG. 4A is a block diagram illustrating a side view for a cooling system for vertically mounted devices for an enclosed electronic package (EEP) according to one embodiment.

FIG. 4A is a block diagram illustrating a side view for a cooling system for vertically mounted devices for an enclosed electronic package (EEP) according to one embodiment. Referring to FIG. 4A, cooling system 300 includes an electronic package that has a motherboard 401. The fluid cooling modules/devices 309 (e.g., cooling plates or mounting/support plate as part of the mounting devices) are installed on the electronics 313 which are vertically mounted on the motherboard 401. For example, the vertically mounted electronics 313 can be attached to the motherboard 401 through PCIE bus. Since the electronics/hardware is mounted in a vertical manner, the fluid cooling devices 309 can be mounted on one side or both sides of the electronics in the fashion shown in FIG. 4A. For some of the electronics, two cooling plates 409 are sandwiched between the electronics 313, and for some of the electronics, a single cooling plate 409 is used, and the other side is a support 403. The support 403 can be a mounting plate, or a support plate or a support panel.

In one embodiment, cooling system 300 includes one or more fluid loops 405. A fluid loop can include fluid tube/hoses. The fluid loops 405 can be pre-assembled to the cooling module 309, or detachable loops via couplers at the end interfaced with the cooling module 309. When the cooling plates 409 (as part of cooling module 309) are attached to the electronics 313 in a manner shown in FIG. 4A, horizontal pressure applied between the vertically mounted electronics 313 and the cooling plate(s) 409 ensures a proper thermal contact between the electronics 313 and the cooling plates 409. Furthermore, thermal paste can be used for the electronics-cooling plates interface (not shown in FIG. 4A).

Figure 4B:
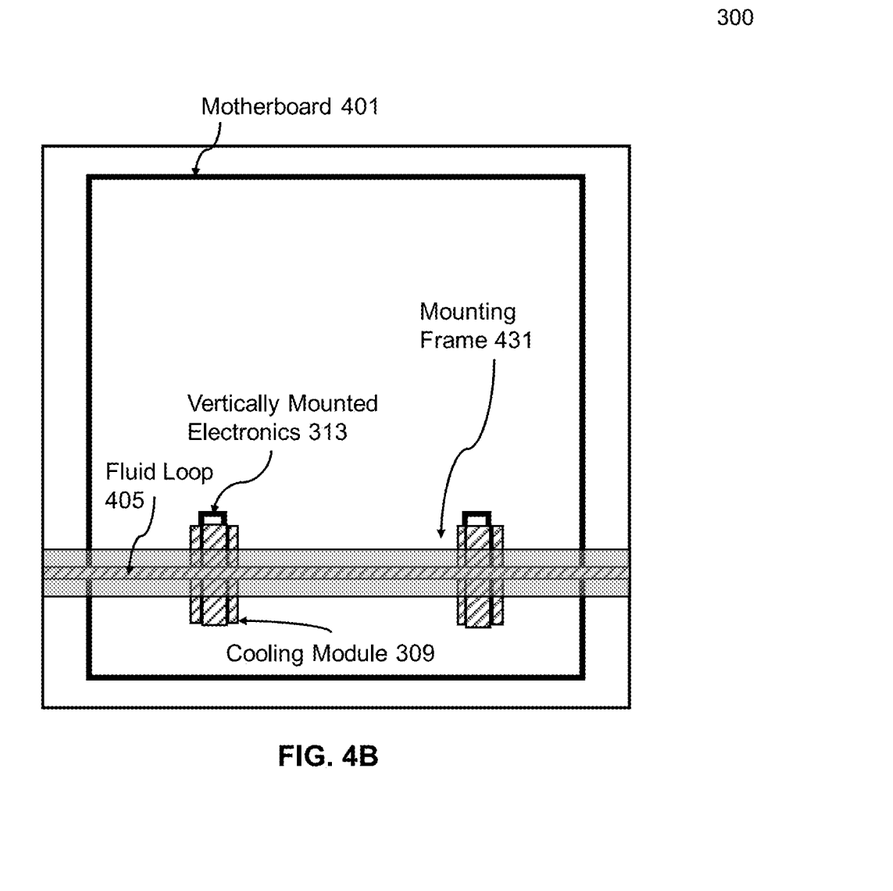
FIG. 4B is a block diagram illustrating a top view for a cooling system for vertically mounted devices for an EEP according to one embodiment.

FIG. 4B is a block diagram illustrating a top view for a cooling system for vertically mounted devices 313 for an EEP according to one embodiment. FIG. 4B shows a top view of cooling system 300 for vertically mounted devices 313. Cooling system 300 can include a mounting frame 431. There are multiple functions provided by the mounting frame 431. First, the mounting frame 431 can be used as a structural support for the cooling devices (e.g., cooling plate) and fluid loops. A second function is to provide a separation of the fluid loop 405 and the electronics 313/motherboard 401. A third function is for mounting and fixing of the cooling modules 309 onto the chassis as well as the electronics 313. In one embodiment, the mounting frame 431 is attached to one or more side or bottom panels of the chassis. In one embodiment, the mounting frame is pre-assembled with the chassis. In another embodiment, the mounting frame is attached to the chassis via one or more mounting structures that are attached to the chassis.

Figure 5:
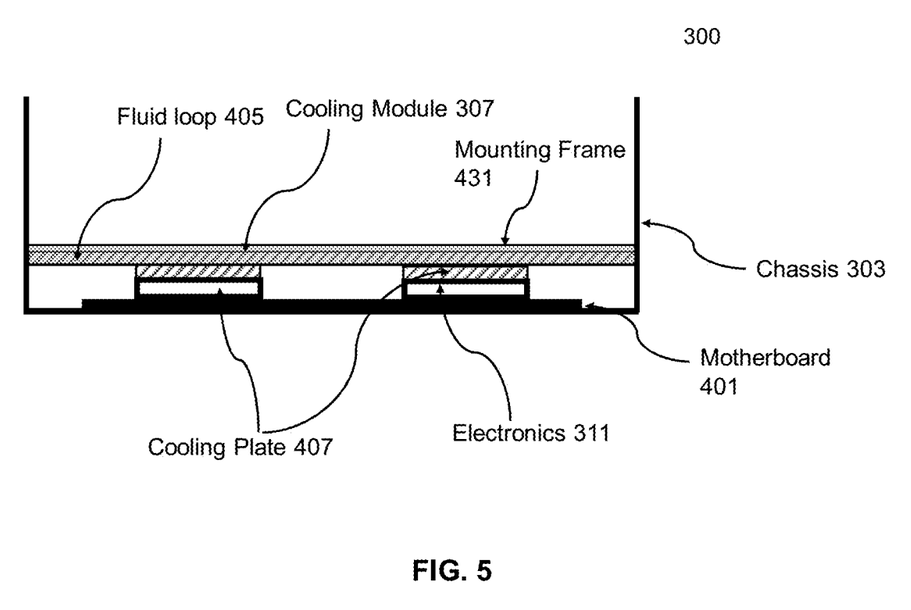
FIG. 5 is a block diagram illustrating a side view for a cooling system for horizontally mounted devices for an EEP according to one embodiment.

FIG. 5 is a block diagram illustrating a side view for a cooling system for horizontally mounted devices for an EEP according to one embodiment. FIG. 5 shows cooling system 300 for electronics 311 which are installed on the motherboard 401 in a horizontal manner, such as, through pin sockets. It can be seen that the cooling modules 307 (e.g., cooling plates 407 as part of the cooling modules 307) are attached over the top of the electronics. Here, the one or more cooling devices are each attached to one of the electronics 311 (such as high density power processors/microcontrollers, etc.). In this case, the electronics are not required to be modified for a cold plate to be mounted on the electronics. Rather, the mounting frame supports the mounting and fixing of the cooling modules.

Figure 6:
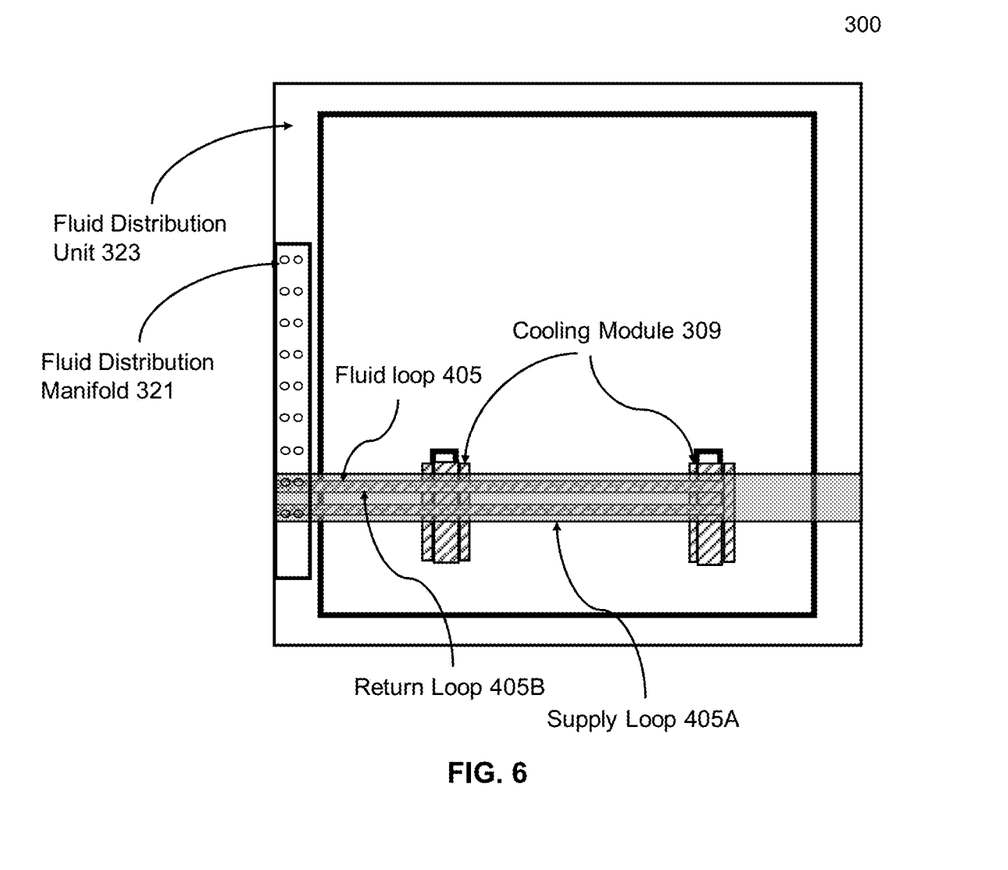
FIG. 6 shows a top view of a fluid distribution unit for an EEP according to one embodiment.
Figure 7:
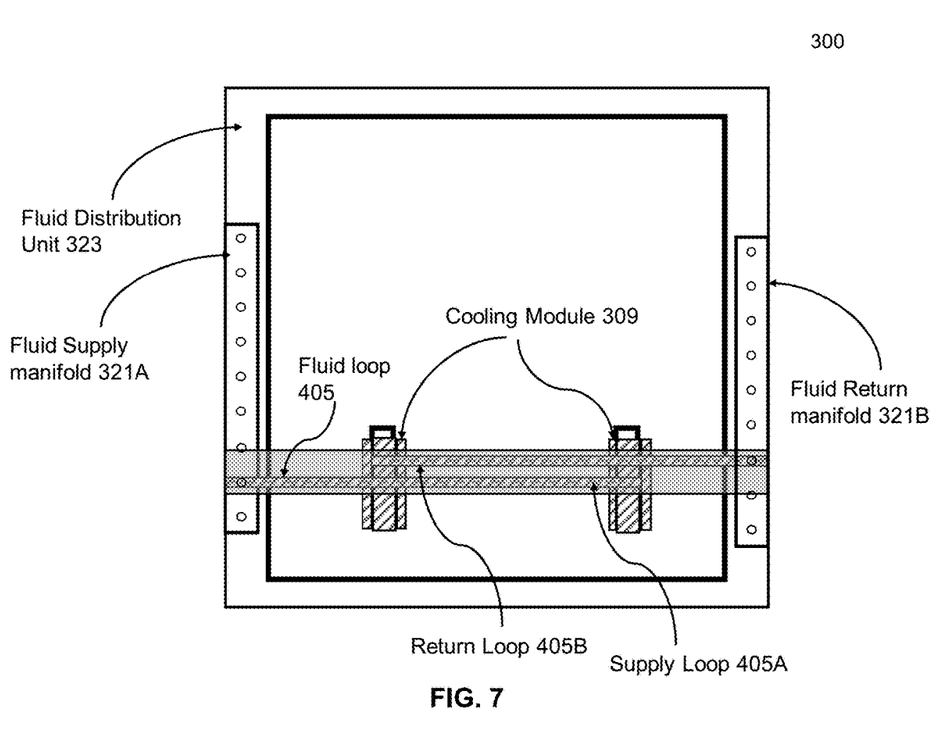
FIG. 7 shows a top view of a fluid distribution unit for an EEP according to one embodiment.

FIG. 6 shows a top view of a fluid distribution unit for an EEP according to one embodiment. FIG. 7 shows a top view of a fluid distribution unit for an EEP according to one embodiment. FIGS. 6-7 show two implementations for the fluid distribution unit 323 to deliver fluid to the cooling modules 309. FIG. 6 shows a fluid distribution manifold 321 (as part of the fluid distribution unit 323) which supply and return fluid at the same side of the chassis. Two cold plates (as part of cooling module 309) are connected to a fluid loop 405, the fluid loop 405 connected to the fluid distribution manifold 421. The fluid loop can include a supply loop 405A, and a return loop 405B, that respectively supplies a cooling fluid to, and returns a warm fluid from, a cold plate.

In one embodiment, a loop of the cold plate is assembled with dripless quick disconnects used with ports of a fluid distribution manifold. In one embodiment, each cold plate has its corresponding fluid loop. In another embodiment, one or more cold plates share a fluid loop. FIG. 7 shows a fluid supply manifold and a fluid return manifold, which supplies and returns fluid respectively, on opposing sides of the chassis. The fluid supply/return manifolds can be configured on the side panels of the chassis within the chassis enclosure. It should be mentioned that the manifolds and fluid loops can be designed in different manners not only as that illustrated in FIGS. 6-7. For example, the loop design can consider a parallel distribution of fluid using multiple loops each for a different cooling plate.

Figure 8:
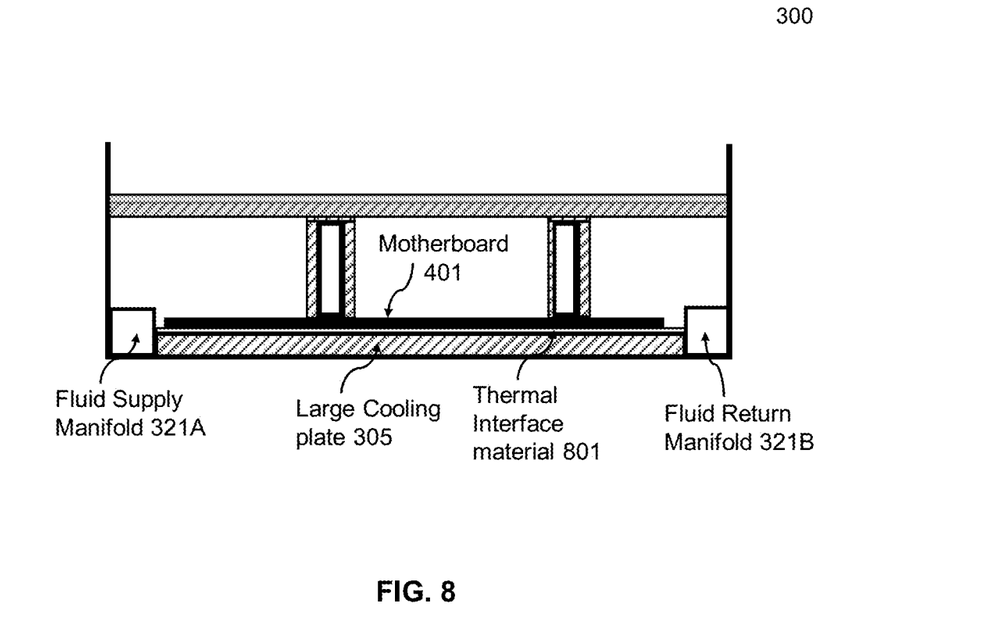
FIG. 8 shows a side view of a fluid cooling plate for an EEP according to one embodiment.

FIG. 8 shows a side view of a fluid cooling plate for an EEP according to one embodiment. FIG. 8 shows a large fluid cooling plate 305 situated near the bottom portion of the electronics (e.g., a motherboard 401 with electronics). Since additional heat is generated by these electronics packaged within the chassis enclosure (these devices may be low power density components), because these devices are low power density devices, thermal conduction through the large cooling plate may be sufficient for their normal operation. Therefore, the large fluid cooling plate can be used for the motherboard electronics to provide additional cooling to the motherboard electronics. In one embodiment, thermal interface material 801 is applied between the large cooling plate 305 and the motherboard electronics 401.

Figure 9:
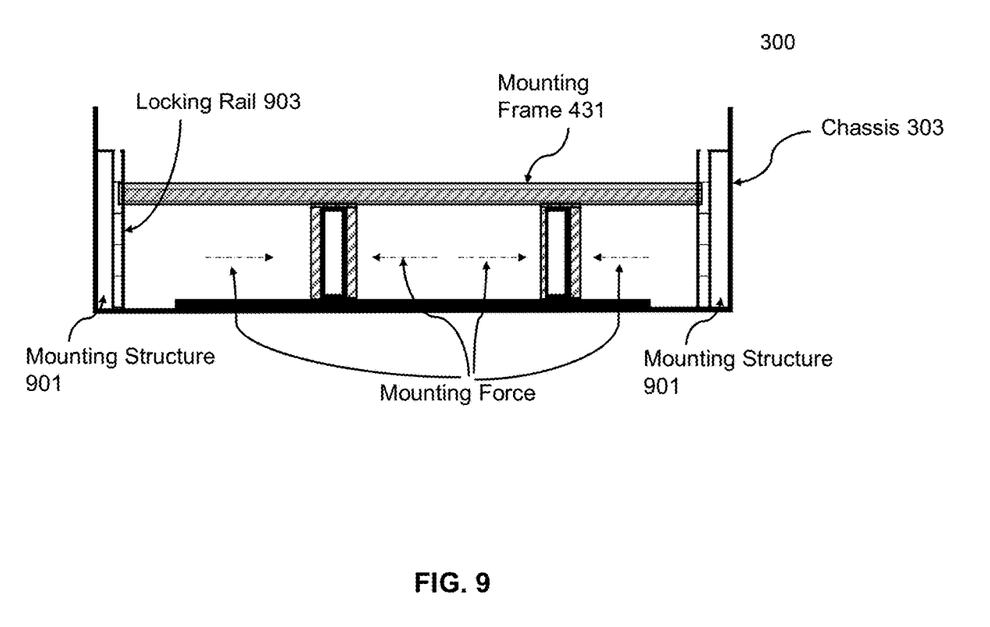
FIG. 9 shows a side view for mounting structures for an EEP according to one embodiment.

FIG. 9 shows a side view for mounting structures for an EEP according to one embodiment. FIG. 9 shows one or more mounting structures attached to a chassis side panel. The mounting structures 901 may be pre-assembled or installed to the chassis 303 after assembly. The mounting structure 901 can provide an insert opening for a mounting frame 431 to be inserted into the mounting structure 901. When inserted, the mounting frame 431 is structurally supported by the mounting structure 901 and the chassis 303. Thereafter, cooling modules for cooling devices (e.g., cooling plates) can be attached to the mounting frame. In one embodiment, a mounting frame has a length equal to a length the chassis. The two ends of the mounting frame can be inserted into two mounting structures, at opposing ends of the chassis.

The structural design of the mounting structure can enable a mounting frame to be inserted from a top-down fashion onto the mounting structure. In one embodiment, the mounting structure includes a locking rail 903. The locking rail 903 can be a directional rail. For horizontally mounted electronics, where a cooling module is attached to the mounting frame, an operator can apply pressure and push down on the cooling module to insert the mounting frame into the locking rail, a cooling plate (as part of the cooling module) is then able to load pressure onto the electronics via the locking rail. Here, the locking rail enables the mounting frame to insert downwards and at the same time prevent upward movements. Once the mounting frame is pushed to a certain vertical position, the mounting frame is fixed to the locking rail. Thus, proper pressure can be loaded onto horizontally mounted electronics.

Similar procedure can be applied by an operator for vertically mounted electronics, except pressure is applied to cooling devices sandwiched between vertically mounted electronics, such as PCIE electronics. In this case, the mounting and installing of the mounting frame onto the mounting structure is not required to apply pressure downwardly. Rather, the mounting frame requires to be installed to a certain height. Cooling devices/modules (which may be have adjustable heights or structural designs) can then be pressured against surfaces of the vertically mounted electronics. This way, the pressure loaded on the cooling devices/module is directly transferred to the electronics, fixated by the mounting frame and mounting structures.

Figure 10:
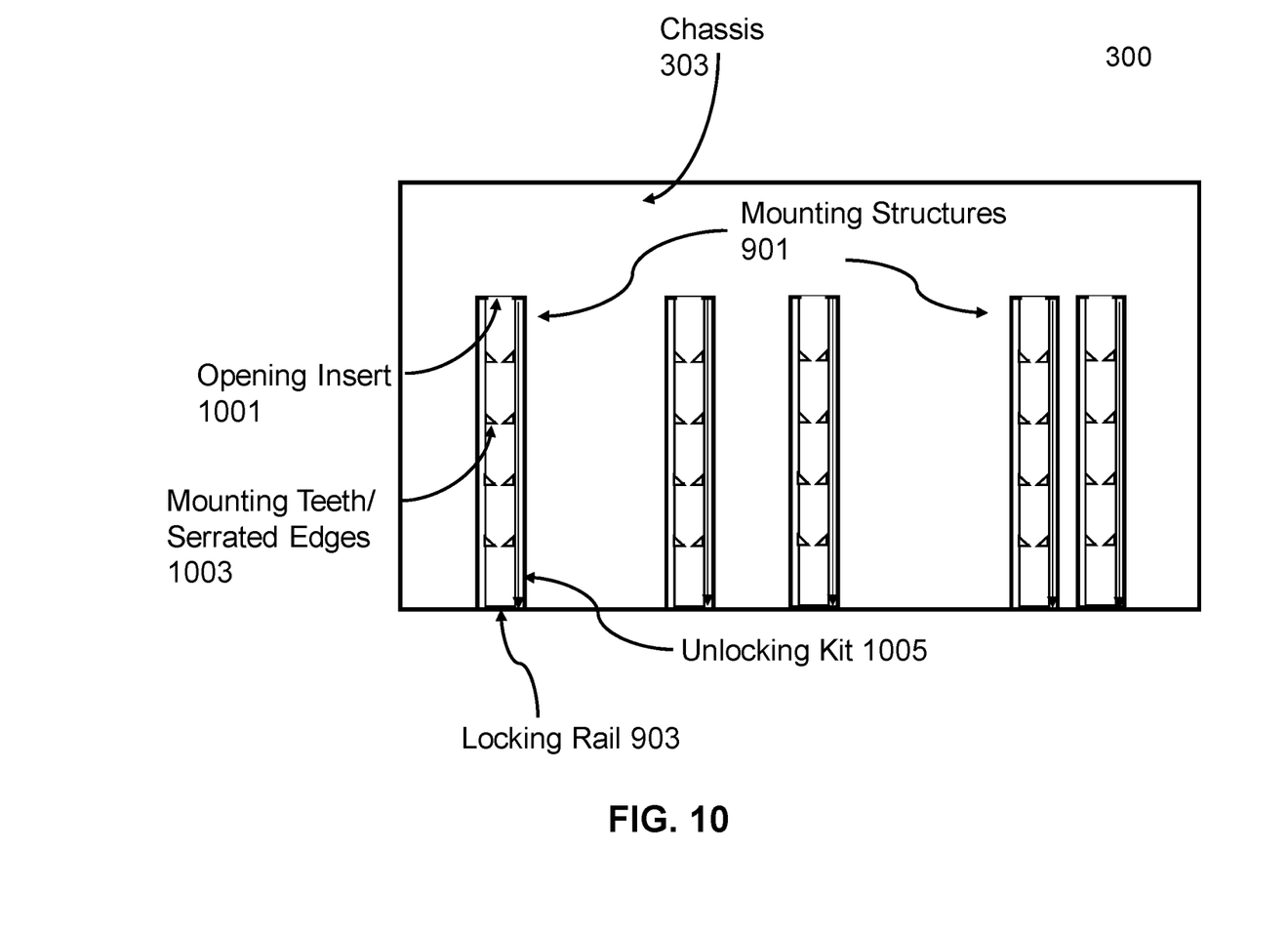
FIG. 10 shows a side view showing mounting serration or teeth for mounting structures for an EEP according to one embodiment.

FIG. 10 shows a side view showing mounting/locking teeth (serrated edges) for mounting structures for an EEP according to one embodiment. FIG. 10 shows a number of mounting structures 901 installed on one side panel of a chassis enclosure. Each mounting structure includes a locking rail 903 coupled to the mounting structure 901, the locking rail 903 includes an opening insert (or vertical mounting slot) 1001 used as an inlet for an end portion of a mounting frame (not shown) to be inserted into the mounting structure. The locking rail includes the mounting teeth 1003 (or serrated teeth or serrated edges) used for locking and fixing the mounting frame to the mounting structure.

In one embodiment, the serrated teeth 1003 are pointing in one direction, allowing the mounting frame to be inserted in one direction from top to bottom but not removable. The mounting frame edges may have corresponding teeth that can fit or lock with the mounting teeth. In one embodiment, the mounting structure includes an unlocking kit 1005. The unlocking kit 1005 can be activated to release the mounting teeth. Once the mounting teeth are release, the mounting frame can be removed from the mounting structure. It should be mentioned that the current implementation is only one possible implementation for realizing the concept. However, other design or implementations can be used to achieve similar functions or results for both the mounting frame or mounting teeth.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A fluid cooling system, comprising:
 an electronics package mounted on a motherboard housed within a chassis;
 a first mounting structure attached to a first side panel of the chassis, including a first vertical mounting slot;
 a second mounting structure attached to a second side panel of the chassis, including a second vertical mounting slot; and
 a fluid cooling module across on top of the electronics package, wherein the fluid cooling module is mounted on the first and second mounting structures by inserting a first end and a second end of the fluid cooling module into the first and second vertical mounting slots,
 wherein the fluid cooling module is to provide fluid cooling to a cooling plate attached to a top surface of the electronics package, wherein the fluid cooling module includes a mounting rail attached to a mounting frame, the mounting frame attached to the first and second mounting structures of the chassis.

2. The system of claim 1, wherein the chassis forms a fully enclosed environment for the electronics package such that no external air is exchanged with air internal to the fully enclosed environment.

3. The system of claim 1, wherein the fluid cooling module includes:
 a fluid loop formed on the mounting rail; and
 one or more cooling devices coupled to the fluid loop, wherein the one or more cooling devices are secured to electronics of the electronics package through the mounting rail.

4. The system of claim 3, further comprising a fluid distribution unit coupled to the chassis, including
 a fluid inlet;
 a fluid outlet; and
 a fluid distribution channel coupled to the fluid inlet and the fluid outlet, the fluid
 distribution channel to distribute a fluid from the fluid inlet to the fluid outlet.

5. The system of claim 4, wherein the fluid loop is coupled to the fluid distribution channel of the fluid distribution unit.

6. The system of claim 4, wherein the fluid distribution unit further comprises a fluid distribution manifold situated near the first side panel of the chassis to receive cooling fluid from the fluid inlet and to return warmer fluid to the fluid outlet.

7. The system of claim 6, wherein the fluid loop includes a fluid supply loop section and a fluid return loop section, wherein the fluid supply loop section is to receive the cooling fluid from the fluid inlet via the fluid distribution manifold to supply the cooling fluid to the electronics and the fluid return loop section is to return the warmer fluid from the electronics to the fluid outlet via the fluid distribution manifold.

8. The system of claim 4, wherein the chassis fluid distribution unit includes:
a fluid supply manifold situated near the first side panel of the chassis to receive cooling fluid from the fluid inlet; and
a fluid return manifold situated near the second side panel of the chassis to return warmer fluid to the fluid outlet.

9. The system of claim 8, wherein the fluid loop includes a fluid supply loop section and a fluid return loop section, wherein the fluid supply loop section is to receive the cooling fluid from the fluid inlet via the fluid supply manifold to cool the one or more cooling devices and the fluid return loop section is to return the warmer fluid from the one or more cooling devices to the fluid outlet via the fluid return manifold.

10. The system of claim 8, wherein the fluid loop is a flexible fluid tube.

11. The system of claim 3, wherein each of the one or more cooling devices comprise one or more cooling plates secured to at least a surface of the electronics to cool the surface of the electronics.

12. The system of claim 11, wherein each of the one or more cooling plates is attachable to the fluid loop, wherein a loop of the cooling plate is assembled with dripless quick disconnects used with ports of a fluid distribution manifold.

13. The system of claim 11, wherein the electronics include peripheral component interconnect express (PCIe) electronics coupled to a PCIe bus, and the one or more cooling plates are pressured to a surface of the PCIe electronics.

14. The system of claim 3, further comprising a large cooling plate assembled near a bottom portion of the chassis, wherein the large cooling plate is positioned at a bottom surface of the motherboard to cool the bottom surface of the motherboard.

15. The system of claim 14, wherein the large cooling plate is assembled directly to a distribution channel of a fluid distribution unit to bypass a fluid loop.

16. The system of claim 3, wherein each of the first and second mounting structures comprises:
a plurality of mounting teeth along a length of the mounting structure to lock a mounting frame to the mounting structure; and
an unlock latch to deactivate the plurality of mounting teeth to release the mounting frame from the mounting structure.

17. The system of claim 1, wherein the electronics package includes electronics of a server blade as part of a server rack.

18. The system of claim 1, wherein the electronics package includes electronics of an edge computing device for an autonomous vehicle.

19. A data processing system housed within a chassis, comprising:
a motherboard;
a central processing unit (CPU) mounted on the motherboard;
an electronics package mounted on the motherboard housed within the chassis;
a first mounting structure attached to a first side panel of the chassis, including a first vertical mounting slot;
a second mounting structure attached to a second side panel of the chassis, including a second vertical mounting slot; and
a fluid cooling module across on top of the electronics package, wherein the fluid cooling module is mounted on the first and second mounting structures by inserting a first end and a second end of the fluid cooling module into the first and second vertical mounting slots,
wherein the fluid cooling module is to provide fluid cooling to a cooling plate attached to a top surface of the electronics package, wherein the fluid cooling module includes a mounting rail attached to a mounting frame, the mounting frame attached to the first and second mounting structures of the chassis.

20. An electronic rack of a data center, comprising:
an array of server blades arranged in a stack, each server blade including one or more servers housed within a chassis, each of the one or more servers comprises:
a motherboard;
a central processing unit (CPU) mounted on the motherboard;
an electronics package mounted on the motherboard housed within the chassis;
a first mounting structure attached to a first side panel of the chassis, including a first vertical mounting slot;
a second mounting structure attached to a second side panel of the chassis, including a second vertical mounting slot; and
a fluid cooling module across on top of the electronics package, wherein the fluid cooling module is mounted on the first and second mounting structures by inserting a first end and a second end of the fluid cooling module into the first and second vertical mounting slots,
wherein the fluid cooling module is to provide fluid cooling to a cooling plate attached to a top surface of the electronics package, wherein the fluid cooling module includes a mounting rail attached to a mounting frame, the mounting frame attached to the first and second mounting structures of the chassis.

\* \* \* \* \*